United States Patent
Ramaswamy et al.

(10) Patent No.: US 10,930,540 B2
(45) Date of Patent: *Feb. 23, 2021

(54) ELECTROSTATIC CHUCK ASSEMBLY HAVING A DIELECTRIC FILLER

(71) Applicant: Applied Materials, Inc., Santa Clara, CA (US)

(72) Inventors: Kartik Ramaswamy, San Jose, CA (US); Anwar Husain, Pleasanton, CA (US); Haitao Wang, Fremont, CA (US); Evans Yip Lee, Milpitas, CA (US); Jaeyong Cho, San Jose, CA (US); Hamid Noorbakhsh, Oakland, CA (US); Kenny L. Doan, San Jose, CA (US); Sergio Fukuda Shoji, San Jose, CA (US); Chunlei Zhang, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/674,974

(22) Filed: Nov. 5, 2019

(65) Prior Publication Data
US 2020/0066566 A1  Feb. 27, 2020

Related U.S. Application Data

(63) Continuation of application No. 15/495,909, filed on Apr. 24, 2017, now Pat. No. 10,504,765.

(51) Int. Cl.
*C23C 14/35* (2006.01)
*H01L 21/683* (2006.01)
*H01L 21/687* (2006.01)

(52) U.S. Cl.
CPC .... *H01L 21/6833* (2013.01); *H01L 21/68757* (2013.01); *H01J 2237/20* (2013.01)

(58) Field of Classification Search
CPC . C23C 14/35; C23C 14/0623; C23C 14/3407; H01L 21/683
See application file for complete search history.

(56) References Cited

U.S. PATENT DOCUMENTS 7,727,354 B2  6/2010  Park et al.
8,221,602 B2  7/2012  Brown et al.
(Continued)

OTHER PUBLICATIONS

Non-Final Office Action from U.S. Appl. No. 15/495,909 dated Jan. 2, 2019, 8 pgs.
(Continued)

*Primary Examiner* — Robert M Kunemund
(74) *Attorney, Agent, or Firm* — Schwabe, Williamson & Wyatt, P.C.

(57) ABSTRACT

Embodiments include an electrostatic chuck assembly having an electrostatic chuck mounted on an insulator. The electrostatic chuck and insulator may be within a chamber volume of a process chamber. In an embodiment, a ground shield surrounds the electrostatic chuck and the insulator, and a gap between the ground shield and the electrostatic chuck provides an environment at risk for electric field emission. A dielectric filler can be placed within the gap to reduce a likelihood of electric field emission. The dielectric filler can have a flexible outer surface that covers or attaches to the electrostatic chuck, or an interface between the electrostatic chuck and the insulator Other embodiments are also described and claimed.

9 Claims, 3 Drawing Sheets

(56) References Cited

U.S. PATENT DOCUMENTS

| | | |
|---|---|---|
| 10,504,765 B2 * | 12/2019 | Ramaswamy .... H01L 21/68757 |
| 2004/0055709 A1 | 3/2004 | Boyd, Jr. et al. |
| 2004/0173455 A1 | 9/2004 | Wang |
| 2008/0099326 A1 | 5/2008 | Ye et al. |
| 2010/0027188 A1 | 2/2010 | Liu et al. |
| 2016/0035610 A1 | 2/2016 | Park et al. |

OTHER PUBLICATIONS

Final Office Action from U.S. Appl. No. 15/495,909 dated Apr. 26, 2019, 5 pgs.

* cited by examiner

US 10,930,540 B2

ELECTROSTATIC CHUCK ASSEMBLY HAVING A DIELECTRIC FILLER

CROSS-REFERENCE TO RELATED APPLICATIONS

This application is a continuation of U.S. patent application Ser. No. 15/495,909, filed on Apr. 24, 2017 now U.S. Pat. No. 10,504,765, the entire contents of which are hereby incorporated by reference herein.

BACKGROUND

1) Field

Embodiments relate to the field of semiconductor processing and, in particular, to semiconductor processing equipment.

2) Description of Related Art

The semiconductor manufacturing industry supplies products, such as semiconductor devices, having integrated structures. The structures, e.g., transistor structures, continue to become more complex. Furthermore, the required size of these structures continues to decrease.

An example of a semiconductor product having small and complex transistor structures is a flash memory product having NAND memory structures. Such products typically include a chain of vertically stacked transistors instead of laterally placed transistors. Vertical stacking may be necessary to achieve the product size specifications. Vertical structures, however, may require very high aspect ratio holes to make contacts or deep trenches for laying the infrastructure for electrical pathways. Accordingly, the realization of next-generation transistor structures, such as high aspect ratio holes, may require the development of next-generation manufacturing equipment.

SUMMARY

Embodiments include an electrostatic chuck assembly including a dielectric filler to reduce a likelihood of voltage breakdown between a support member and a ground shield. In an embodiment, an electrostatic chuck assembly includes a support member within a process chamber. The support member may include an electrostatic chuck surrounded by a ground shield. During an etching process, the electrostatic chuck may act as a cathode and be maintained at a high voltage, and the ground shield may be electrically grounded. Accordingly, a chance of electrons arcing from the electrostatic chuck to the ground shield exists. In an embodiment, the electrostatic chuck assembly includes a dielectric filler between the electrostatic chuck and the ground shield to prevent such arcing.

The dielectric filler may be at least partially formed from a material having a higher flexibility than the surrounding structures of the support member and the ground shield. For example, the dielectric filler may have a flexible outer surface including a chemical vapor deposited poly(p-xylylene) polymer. The flexible outer surface may cover an interface between the electrostatic chuck and a mating component, e.g., an insulator under the electrostatic chuck. Accordingly, the flexible outer surface may fill any crevices or gaps at the interface to displace air or process gases that could otherwise form a triple point susceptible to electrical discharge.

In an embodiment, one or more of the interfaces of the support member, e.g., the interface at a transition between a lower edge of the electrostatic chuck and an upper edge of the insulator, can include transitional edges to grade an electrical field at the interface. For example, the edge(s) may be rounded or chamfered corners, or the edges may be vertically aligned. Accordingly, sharp and exposed corners that could otherwise be susceptible to electrical discharge may be eliminated.

The above summary does not include an exhaustive list of all aspects. It is contemplated that all systems and methods are included that can be practiced from all suitable combinations of the various aspects summarized above, as well as those disclosed in the Detailed Description below and particularly pointed out in the claims filed with the application. Such combinations have particular advantages not specifically recited in the above summary.

DETAILED DESCRIPTION

Figure 1:
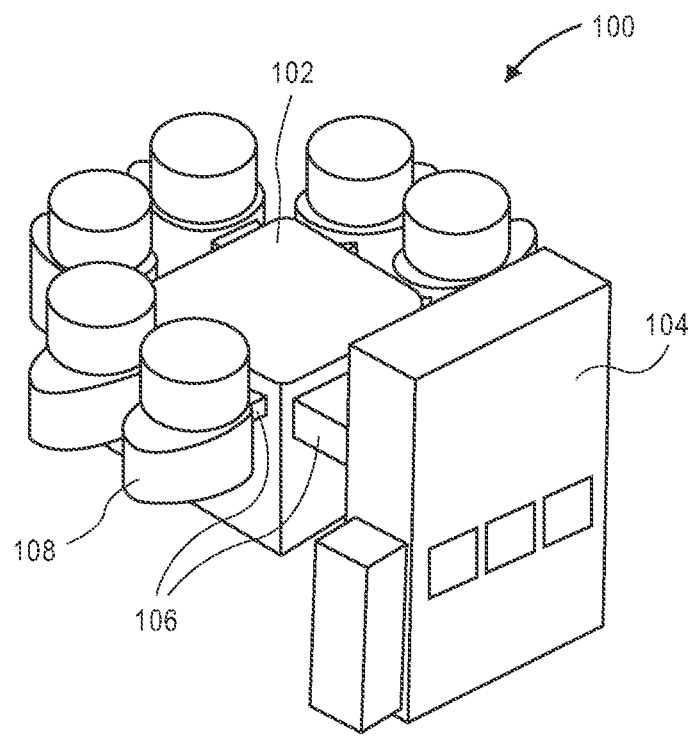
FIG. 1 is a perspective view of a processing system, in accordance with an embodiment.

Processing systems having a dielectric filler between a support member and a ground shield are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

Vertical transistor structures, such as vertical NAND memory structures, create unique manufacturing challenges. For example, etching of high aspect ratio holes may require high ion energies and an abundant supply of ions (high ion flux). If high ion energies and flux are not provided, etched features can bend, twist, or lose cadence, resulting in a suboptimal or unacceptable product. High ion energies are formed by applying high voltages, e.g., voltages greater than 5 kV peak-to-peak, to an electrostatic chuck holding the wafer being etched. As noted below, however, process gases may flow between the electrostatic chuck and a ground shield during etching, and at high voltages, voltage breakdown can occur through electrical discharge. More particularly, electrical field enhancements may be present in existing wafer processing systems that lead to voltage breakdown under the manufacturing conditions used for forming high aspect ratio holes. Process kits may be used to minimize gaps between the electrostatic chuck and the ground shield, however, existing process kits sections include some gaps to accommodate expansions of different process kit materials, e.g., ceramic, aluminum, quartz, etc. Accordingly, improved wafer processing systems may be needed to reduce the likelihood of catastrophic arcing during the manufacture of next-generation transistor structures.

In an aspect, a processing system having a support member that is resistant to voltage breakdown is provided. The processing system can be used to manufacture semiconductor devices and semiconductor wafers, and may be referred to as a wafer processing system without being limited to the manufacture of wafers. The processing system may include an electrostatic chuck and a ground shield separated from each other by a gap. In an embodiment, a dielectric filler is placed between the electrostatic chuck and the ground shield to displace any process gases that could lead to electrical discharge under high voltage chucking conditions. The dielectric filler may both bridge the gap between the electrostatic chuck and the ground shield, and cover features of the support member that act as electric field enhancements. For example, the electrostatic chuck may be mounted on an insulator, and outward edges of the electrostatic chuck and insulator may be sharp edges that are preferential electrical discharge sites. The dielectric filler may cover the outward edges and/or a transition region between the edges. Furthermore, the edges may be rounded, chamfered, or otherwise formed as transitional edges. Accordingly, a likelihood of electrical discharge under high voltage chucking conditions may be reduced by a dielectric filler and a design of support member.

Referring to FIG. 1, a perspective view of a processing system is shown in accordance with an embodiment. A processing system 100 may include a buffer chamber 102 physically connected to a factory interface 104 by one or more load locks 106. Furthermore, one or more process chambers 108 may be physically connected to buffer chamber 102 by one or more respective load locks 106. Buffer chamber 102 may essentially act as an intermediate volume, larger than respective volumes of process chambers 108, that remains at a low pressure, albeit at a pressure higher than the process pressures within process chambers 108. Thus, a semiconductor wafer, e.g., a silicon wafer, may be moved between chambers of processing system 100 under vacuum conditions during the manufacture of semiconductor devices. This movement may be enabled by various devices included in the processing system 100, e.g., robotic arms, shuttles, etc.

Various manufacturing operations may be performed in process chambers 108. For example, at least one of process chambers 108 may be a plasma etch chamber, a deposition chamber, a chamber of a semiconductor lithography tool, or any other semiconductor process tool chamber. As such, process chamber 108 may be used to perform manufacturing processes under vacuum conditions and at elevated or lowered temperatures. The manufacturing operations may include etching high aspect ratio trenches or holes in a semiconductor wafer. The trenches or holes may be subsequently filled with a conductive material, e.g., copper, to form product features such as electrical vias and interconnects.

Figure 2:
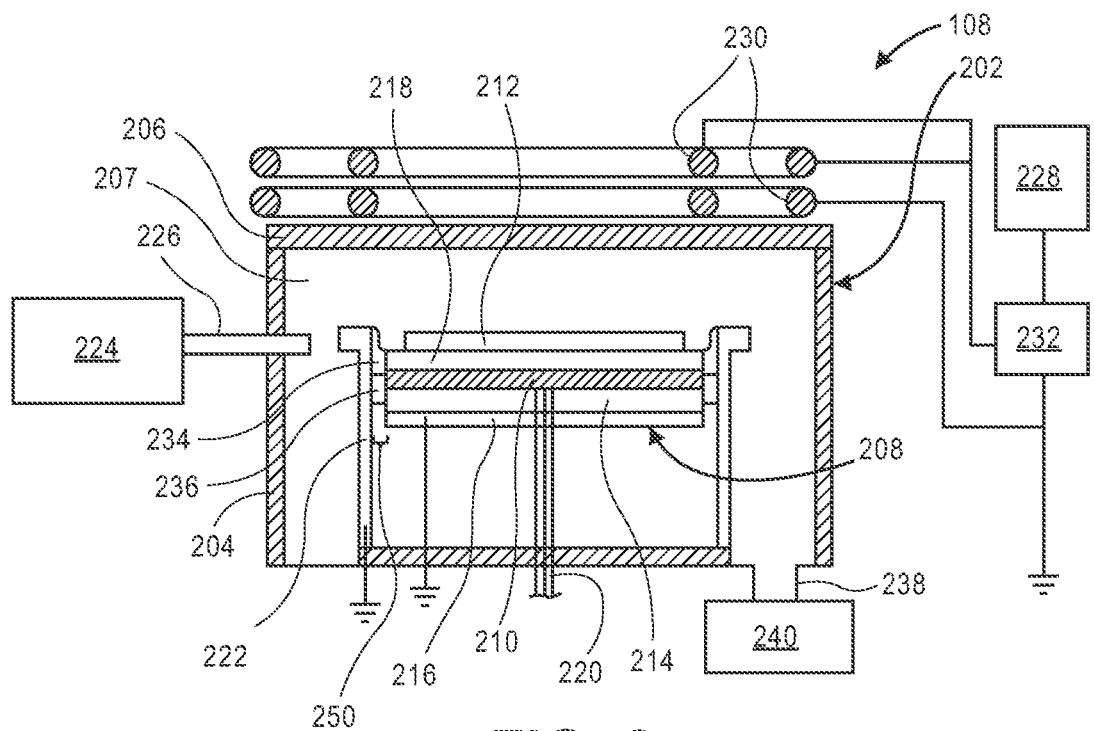
FIG. 2 is a schematic of a processing system, in accordance with an embodiment.

Referring to FIG. 2, a schematic of a processing system is shown in accordance with an embodiment. Process chamber 108 of processing system 100 can be a plasma etch chamber, a capacitive coupled parallel plate chamber, or a magnetically enhanced ion etch chamber. Accordingly, the particular embodiment of process chamber 108 illustrated in FIG. 2 is illustrative, and not limiting. Process chamber 108 may include a chamber body 202. Chamber body 202 can include a chamber wall 204, e.g., a cylindrical sidewall, and a chamber lid 206 mounted on chamber body 202. Chamber lid 206 may be flat, rectangular, arcuate, conical, dome or multi-radius shaped. Chamber body 202 may also include a chamber bottom, and thus, a chamber volume 207 can be enclosed within chamber body 202 between chamber wall 204, chamber lid 206, and the chamber bottom. That is, chamber wall 204 may extend around chamber volume 207.

A support member 208 may be disposed within chamber volume 207. Support member 208 may hold manufacturing targets, such as substrates or wafers, and may be referred to as a wafer support member or a substrate support member without being limited to the manufacture of a wafer or substrate. Chamber body 202 may extend around support member 208. In an embodiment, support member 208 includes an electrostatic chuck 210 to hold a substrate 212, e.g., a semiconductor wafer, in place during an etching process. For example, substrate 213 may be mounted on support member 208. When substrate 213 is loaded onto support member 208, processing system 100 may be referred to as an etching process assembly.

In an embodiment, electrostatic chuck 210 is mounted on an insulator 214 of support member 208. Insulator 214 can be a disc of microwave polymer, such as polystyrene. Insulator 214 can separate electrostatic chuck 210 from a lower conductive plate 216, e.g., an aluminum plate. Lower conductive plate 216 can be electrically grounded to remain at a ground electrical potential during the etching process. Optionally, support member 208 can include a ceramic layer 218 above electrostatic chuck 210. For example, ceramic layer 218 may be mounted on electrostatic chuck 210 to insulate substrate 212 from electrostatic chuck 210. In an embodiment, ceramic layer 218 is incorporated into electrostatic chuck 210, however, and is not a separate component. For example, ceramic layer 218 may be a coating on electrostatic chuck 210, a cap on electrostatic chuck 210, or a sublayer incorporated directly within the layer representing electrostatic chuck 210. Electrostatic chuck 210 may have an embedded electrode. Accordingly, the representation of ceramic layer 218 as a separate component is provided by way of example, and not limitation. In an embodiment, ceramic layer 218 is formed from a ceramic material, such as alumina.

Electrostatic chuck 210 can be electrically conductive and capable of serving as a process bias cathode. For example, electrostatic chuck 210 may be coupled to a conductive element 220 to transfer RF energy to electrostatic chuck 210. Conductive element 220 may apply a voltage of at least 5 kV peak-to-peak during an etching process. The voltage may be referenced to the ground potential of lower conductive plate 216, or to another structure of processing system 100 held at the ground potential.

In an embodiment, processing system 100 includes a ground shield 222 extending around support member 208. By way of example, ground shield 222 may be a cylindrical conductive tube having an inner surface facing inward toward support member 208. More particularly, the inner surface may face an outer surface of electrostatic chuck 210, which faces outward. Thus, a gap 250 may be measured between the laterally-facing parallel surfaces. Ground shield 222 may be electrically grounded, and thus, an electrical potential difference may exist between electrostatic chuck 210 and ground shield 222 across gap 250.

Process chamber 108 can include a process gas source 224 configured to introduce process gases into the chamber volume 207 through a gas distributor 226. Gas distributor 226 may be peripherally disposed about support member 208 or disposed above support member 208 in chamber lid 206. Mass flow controllers (not shown) for each process gas, or alternatively, for mixtures of the process gas, may be disposed between the chamber body 202 and the process gas source 224 to regulate the respective flow rates of the process gases.

In an embodiment, a plasma zone is defined in chamber volume 207 between support member 208 and chamber lid 206. A plasma is generated in the plasma zone from the process gases by supplying power from a power supply 228, e.g., a coil power supply, to one or more radio frequency (RF) coils 230 through an RF match network 232. Process chamber 108 can include at least one inductive coil 230 disposed above at least a portion of chamber lid 206. In the embodiment depicted in FIG. 2, two concentric inductive coils 230 are shown.

As described below, process gases used to strike the plasma and to perform etching can enter into the gap 250 between support member 208 and ground shield 222. The process gases between the cathode (electrostatic chuck 210) and ground shield 222 can break down under the high voltages applied for etching. Processing system 100 may reduce a likelihood of voltage breakdown in one or more ways. First, a protective cap 234 may be located within the gap 250 between a region of chamber volume 207 above support member 208, e.g., a plasma zone, and a region of chamber volume 207 between support member 208 and ground shield 222. As described below, the protective cap 234 can reduce a likelihood of plasma attacking a dielectric filler 236 located between support member 208 and ground shield 222. Preserving dielectric filler 236 can prevent electrical arcing in gap 250. Second, dielectric filler 236 may be located between electrostatic chuck 210 and ground shield 222 to displace process gases from the areas where voltage breakdown is most likely. Protective cap 234 and dielectric filler 236 are described in more detail below.

Process gases and etchant byproducts may be exhausted from process chamber 108 through an exhaust port 238 to an exhaust system, e.g., a vacuum system 240. Exhaust port 238 may be disposed in chamber body 202, e.g., within a chamber bottom, for removal of process gases. A chamber pressure in chamber volume 207 can be controlled by operation of vacuum system 240. In an embodiment, vacuum system 240 may control the chamber pressure to perform manufacturing processes under vacuum conditions in the $10^{-6}$ Torr range or lower, e.g., in the $10^{-8}$ Torr range.

Voltage breakdown within high voltage etching environments can occur when seed electrons, which may be mainly due to enhanced field emissions, initiate a breakdown and cause a severe arc between support member 208 and ground shield 222. Field enhancements can be caused by a presence of high voltages. For example, processing system 100 may supply voltages higher than 5 kV to electrostatic chuck 210. Field enhancements can also be caused by sharp corners or edges of support member 208. In addition, field enhancements can be caused by a confluence of several features fabricated from several materials having different dielectric constants. For example, when three different materials having different dielectric constants meet at a transition point, the transition point may be referred to as a triple point. Triple points are natural locations for seed electrons to initiate an arc, resulting in a voltage breakdown.

Figure 3:
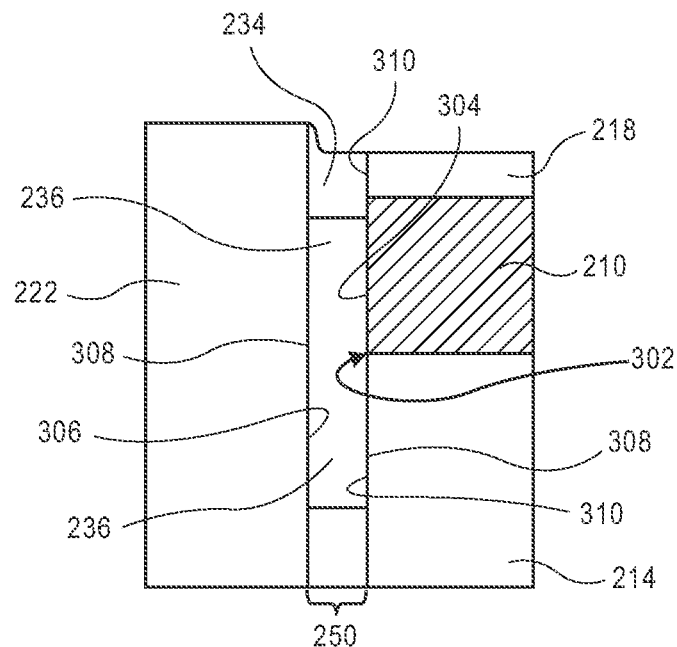
FIG. 3 is a detail view of a bulk dielectric filler component of a processing system, in accordance with an embodiment.

Referring to FIG. 3, a detail view of a bulk dielectric filler component of a processing system is shown in accordance with an embodiment. Processing system 100 may include an interface 302 between two or more components. For example, interface 302 may be a transition point at which electrostatic chuck 210 and insulator 214 meet. When process gases infiltrates gap 250 to interface 302, a triple point exists. The triple point can increase a likelihood of catastrophic arcing when high voltages are applied to electrostatic chuck 210.

In an embodiment, dielectric filler 236 displaces air or process gases within gap 250 at interface 302. More particularly, dielectric filler 236 fills gap 250 between a chuck sidewall 304 of electrostatic chuck 210 and a shield sidewall 306 of ground shield 222. Chuck sidewall 304 and shield sidewall 306 may face each other across gap 250. For example, shield sidewall 306 may face radially inward toward a central axis extending through a center of support member 208, e.g., longitudinally through conductive element 220 and chuck sidewall 304 may face radially outward away from the central axis. Dielectric filler 236 may have an outer surface apposed to each of chuck sidewall 304 and shield sidewall 306. Accordingly, dielectric filler 236 may have a component envelope that includes a portion facing radially inward toward chuck sidewall 304 and a portion facing radially outward toward shield sidewall 306.

The component envelope is an outer surface of dielectric filler 236, and in an embodiment, the outer surface is a flexible outer surface 308. Dielectric filler 236 may include an outer region along flexible outer surface 308 that is formed from a material having a flexibility greater than other materials in a vicinity, e.g., quartz or aluminum. More particularly, flexible outer surface 308 of dielectric filler 236 may be more flexible than ground shield 222, insulator 214, electrostatic chuck 210, ceramic layer 218, and protective cap 234. Dielectric filler 236 may be formed from a bulk material. That is, dielectric filler 236 may be a monolithic shape formed from a single material. The single material may be a flexible material, as compared to surrounding structures. For example, dielectric filler 236 may include bulk polytetrafluoroethylene or a silicone-based epoxy. Accordingly, flexible outer surface 308 can accommodate expansion and contraction of other system components that dielectric filler 236 contacts.

In an embodiment, flexible outer surface 308 of dielectric filler 236 contacts electrostatic chuck 210. For example, flexible outer surface 308 may be placed against, and therefore on, chuck sidewall 304. Flexible outer surface 308 may be attached to chuck sidewall 304. For example, dielectric filler 236 may be bonded to electrostatic chuck 210 by an adhesive, such as a silicone-based epoxy.

Flexible outer surface 308 may contact other components of processing system 100. For example, insulator 214 of support member 208 may include an insulator sidewall 310 facing radially outward. Insulator sidewall 310 can be parallel to, and aligned with, chuck sidewall 304. Accordingly, flexible outer surface 308 may cover interface 302 between chuck sidewall 304 and insulator sidewall 310. More particularly, flexible outer surface 308 may press against, and be located on, insulator sidewall 310.

A radially-outward facing surface portion of flexible outer surface 308 may be continuously or intermittently in contact with ground shield 222. In an embodiment, dielectric filler 236 completely fills gap 250 radially between interface 302 and shield sidewall 306. Thus, the surface portion of flexible outer surface 308 facing shield sidewall 306 may press against, and be on, shield sidewall 306. At times, however, the surface portion of flexible outer surface 308 may separate from shield sidewall 306 to form a transient gap. For example, the transient gap may form when temperature changes within process chamber 108 cause ground shield 222 and/or support member 208 to contract and separate from one another. By contrast, when temperature changes within process chamber 108 cause ground shield 222 and/or support member 208 to expand, a distance across gap 250 may decrease and cause the surface portion of flexible outer surface 308 to press against shield sidewall 306. Transient gap formation can depend on a flexibility and resilience of dielectric filler 236 because when dielectric filler 236 is formed from a sufficiently resilient material, the filler may be wedged into gap 250 to ensure surface contact between flexible outer surface 308 and chuck sidewall 304, shield sidewall 306, or insulator sidewall 310, regardless of a chamber temperature.

Processing system 100 can include protective cap 234 to reduce the likelihood that plasma or other gases in chamber volume 207 will attack a bond between dielectric filler 236 and other structures, such as electrostatic chuck 210. Protective cap 234 can be a quartz cap to prevent ingress of oxygen from the plasma zone above support member 208 into gap 250. Oxygen can degrade the bond, and thus, protective cap 234 may form a barrier to make processing system 100 a more robust system. In an embodiment, protective cap 234 extends from ground shield 222 to ceramic layer 218. For example, ceramic layer 218 may include a ceramic sidewall 310, and protective cap 234 may extend entirely across gap 250 from shield sidewall 306 to ceramic sidewall 310. Similarly, protective cap 234 may extend across gap 250 from shield sidewall 306 to chuck sidewall 304. Protective cap 234 may bridge the gap 250 over dielectric filler 236. Accordingly, protective cap 234 provides a barrier that isolates dielectric filler 236 from oxygen within chamber volume 207.

Figure 4:
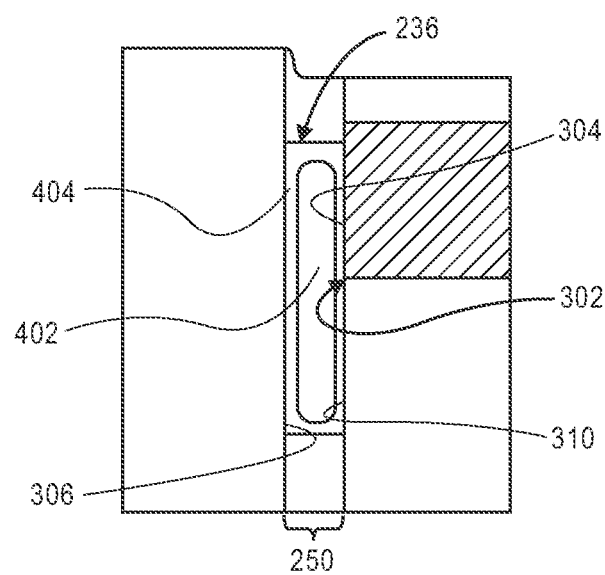
FIG. 4 is a detail view of a multi-layer dielectric filler component of a processing system, in accordance with an embodiment.

Referring to FIG. 4, a detail view of a multi-layer dielectric filler component of a processing system is shown in accordance with an embodiment. In an embodiment, dielectric filler 236 is non-monolithic. Dielectric filler 236 may be composed of several materials having different material properties, e.g., flexibilities. For example, dielectric filler 236 may include a core 402 surrounded by an encapsulation layer 404. Core 402 may be fabricated from a first bulk material to fill a majority of the space between support member 208 and ground shield 222. By way of example, core 402 may be a monolithic shape of bulk polytetrafluoroethylene. Core 402 can fill at least 90% of a cross-sectional area taken radially through gap 250.

A remaining portion of the cross-sectional area of gap 250, which is not filled by core 402, may be filled by encapsulation layer 404. By way of example, encapsulation layer 404 may be a chemical vapor deposited poly(p-xylylene) polymer. Such materials, e.g., Parylene, are flexible and can be conformally applied. That is, encapsulation layer 404 can cover core 402 such that there are no air pockets between core 402 and encapsulation layer 404. Dielectric filler 236 having a multi-layered construction can fill gap 250 in a manner similar to that described above with respect to FIG. 3. More particularly, dielectric filler 236 can press against chuck sidewall 304, insulator sidewall 310, or shield sidewall 306, and may cover interface 302 at which seed electrons have a higher likelihood of shorting across gap 250.

Figure 5:
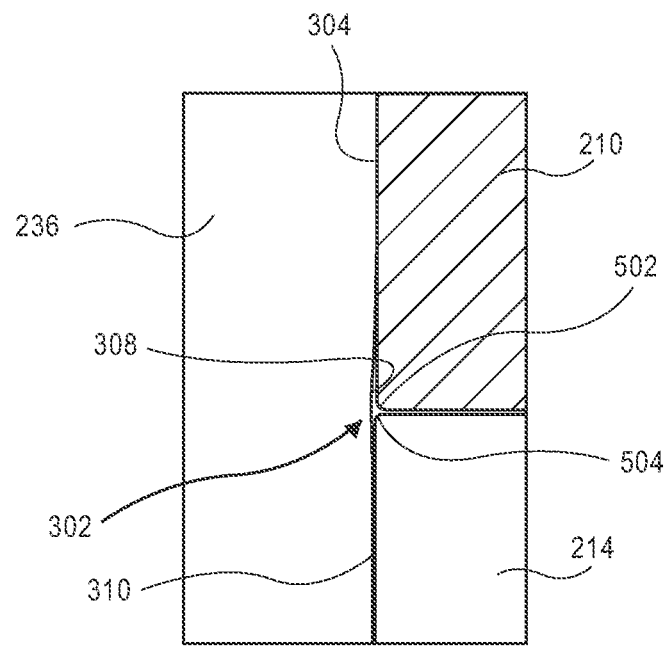
FIG. 5 is a detail view of an interface region having aligned edges of a support member, in accordance with an embodiment.

Referring to FIG. 5, a detail view of an interface region having aligned edges of a support member is shown in accordance with an embodiment. In addition to filling gap 250 dielectric filler 236, a likelihood of catastrophic arcing may be reduced by a design of surface interfaces of support member 208. Interface 302 between electrostatic chuck 210 and insulator 214 is illustrated by way of example, however, similar surface interfaces can be provided at other locations of support member 208. Other locations include an interface between ceramic layer 218 and electrostatic chuck 210.

In an embodiment, interfaces of support member 208 include aligned sidewalls. For example, chuck sidewall 304 may be vertically aligned with insulator sidewall 310 at interface 302. Chuck sidewall 304 can include a lower edge 502 where chuck sidewall 304 meets a bottom surface of electrostatic chuck 210. Similarly, insulator 214 can include an upper edge 504 where insulator sidewall 310 meets an upper surface of insulator 214. Electrostatic chuck 210 and insulator 214 may be sized and aligned such that lower edge 502 and upper edge 504 are radially co-located. That is, lower edge 502 and upper edge 504 may be aligned within a vertical plane and neither edge of interface 302 juts out relative to the other edge. The aligned edges may be covered by flexible outer surface 308 to minimize any gaps 250 at interface 302 between lower edge 502, upper edge 504, and flexible outer surface 308. Accordingly, a likelihood of an electron jumping from interface 302 is reduced.

Figure 6:
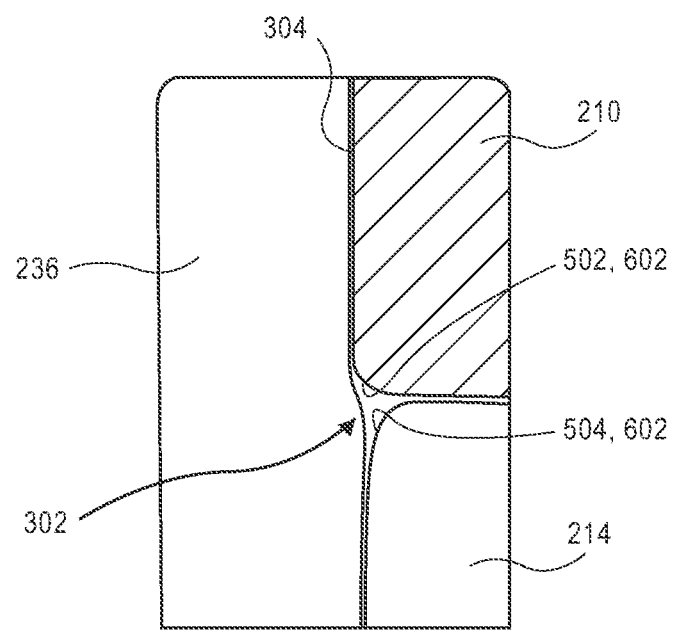
FIG. 6 is a detail view of an interface region having transitional edges of a support member, in accordance with an embodiment.

Referring to FIG. 6, a detail view of an interface region having transitional edges of a support member is shown in accordance with an embodiment. A likelihood of electrons jumping from interface 302 may also be reduced by eliminating sharp edges at interface 302. For example one or more of lower edge 502 or upper edge 504 may be a transitional edge 602. That is, transitional edge 602 can be a non-sharp corner, such as a rounded corner or a chamfer. Transitional edge 602 can extend from a respective sidewall to a respective upper or lower surface. For example, when lower edge 502 of electrostatic chuck 210 is a chamfer, transitional edge 602 extends obliquely relative to chuck sidewall 304 and the lower surface of electrostatic chuck 210 mounted on insulator 214. Transitional edge 602 can grade an electric field around interface 302 to reduce field enhancement caused by sharp corners. Accordingly, a likelihood of an electron jumping from interface 302 is reduced by transitional edge(s) 602.

Processing system 100 incorporating features described above has been built and tested. Test results have shown that deep trench etching can be performed under voltage conditions over 9 kV peak-to-peak, e.g., 9.2 kV peak-to-peak, without catastrophic arcing. Thus, processing system 100 having dielectric filler 236 as described above can be effectively used to manufacture high aspect ratio holes in high-voltage plasma processing environments.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:
1. An electrostatic chuck assembly, comprising:
  a support member including a ceramic layer on an electrostatic chuck on an insulator, wherein the electrostatic chuck includes a chuck sidewall, and the ceramic layer has a top surface;
  a ground shield extending around the support member, wherein the ground shield is electrically grounded, and wherein the ground shield includes a shield sidewall facing the chuck sidewall; and
  a dielectric filler between the chuck sidewall and the shield sidewall, wherein the dielectric filler includes a flexible outer surface on the chuck sidewall, and wherein the dielectric filler has a top surface below the top surface of the ceramic layer of the support member.

2. The electrostatic chuck assembly of claim 1, wherein the top surface of the dielectric filler is below a bottom surface of the ceramic layer of the support member.

3. The electrostatic chuck assembly of claim 1, wherein the flexible outer surface is attached to the chuck sidewall.

4. The electrostatic chuck assembly of claim 2, wherein the flexible outer surface includes a surface portion on the shield sidewall.

5. The electrostatic chuck assembly of claim 1, wherein the chuck sidewall has a lower edge, wherein the insulator has an insulator sidewall having an upper edge, and wherein the flexible outer surface covers the lower edge and the upper edge.

6. The electrostatic chuck assembly of claim 5, wherein one or more of the lower edge or the upper edge is a transitional edge.

7. The electrostatic chuck assembly of claim 1, wherein the dielectric filler includes an encapsulation layer surrounding a core.

8. The electrostatic chuck assembly of claim 7, wherein the core is polytetrafluoroethylene, and wherein the encapsulation layer is a chemical vapor deposited poly(p-xylene) polymer.

9. The electrostatic chuck assembly of claim 1, further comprising a protective cap extending from the ground shield to the ceramic layer over the dielectric filler.

* * * * *